(12) United States Patent
Ng et al.

(10) Patent No.: US 7,590,904 B2
(45) Date of Patent: Sep. 15, 2009

(54) SYSTEMS AND METHODS FOR DETECTING A FAILURE EVENT IN A FIELD PROGRAMMABLE GATE ARRAY

(75) Inventors: Tak-Kwong Ng, Yorktown, VA (US); Jeffrey A. Herath, Yorktown, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 388 days.

(21) Appl. No.: 11/531,703

(22) Filed: Sep. 14, 2006

(65) Prior Publication Data

US 2007/0198892 A1 Aug. 23, 2007

Related U.S. Application Data

(60) Provisional application No. 60/774,810, filed on Feb. 1, 2006.

(51) Int. Cl.
*G01R 31/28* (2006.01)
*H03M 13/00* (2006.01)
*G06F 11/00* (2006.01)
*G06F 7/38* (2006.01)

(52) U.S. Cl. .......... 714/725; 714/724; 714/732; 714/754; 714/48; 326/37; 326/39

(58) Field of Classification Search ............. 714/725, 714/724, 732, 754; 326/37, 39
See application file for complete search history.

(56) References Cited

U.S. PATENT DOCUMENTS

| 6,237,124 | B1 * | 5/2001 | Plants | 714/763 |
|---|---|---|---|---|
| 6,560,743 | B2 * | 5/2003 | Plants | 714/763 |
| 7,263,631 | B2 * | 8/2007 | VanBuren | 714/15 |
| 7,310,759 | B1 * | 12/2007 | Carmichael et al. | 714/725 |
| 2004/0078103 | A1 * | 4/2004 | Marshall et al. | 700/87 |
| 2006/0020774 | A1 * | 1/2006 | Ramos et al. | 712/226 |
| 2007/0176627 | A1 * | 8/2007 | Ng et al. | 326/14 |

* cited by examiner

*Primary Examiner*—John J Tabone, Jr.
(74) *Attorney, Agent, or Firm*—Helen M. Galus; Barry V. Gibbens

(57) ABSTRACT

An embodiment generally relates to a method of self-detecting an error in a field programmable gate array (FPGA). The method includes writing a signature value into a signature memory in the FPGA and determining a conclusion of a configuration refresh operation in the FPGA. The method also includes reading an outcome value from the signature memory.

20 Claims, 2 Drawing Sheets

SYSTEMS AND METHODS FOR DETECTING A FAILURE EVENT IN A FIELD PROGRAMMABLE GATE ARRAY

CLAIM OF BENEFIT OF PROVISIONAL APPLICATION

Pursuant to 35 U.S.C. §119, the benefit of priority from the provisional patent application having U.S. Ser. No. 60/774,810, filed on Feb. 1, 2006, is claimed for this non-provisional application.

ORIGIN OF THE INVENTION

The invention described herein was made by employees of the United States Government and may be manufactured and used by or for the Government of the United States of America for governmental purposes without the payment of any royalties thereon or therefor.

FIELD OF THE INVENTION

This invention relates generally to field programmable gate arrays (FPGA), more particularly, for detecting a failure event in the FPGA.

DESCRIPTION OF THE RELATED ART

A field-programmable gate array (FPGA) is a semiconductor device containing programmable logic components and programmable interconnects. The programmable logic components can be programmed to duplicate the functionality of basic logic gates (such as AND, OR, XOR, NOT) or more complex combinatorial functions such as decoders or simple math functions. In most FPGAs, these programmable logic components (or logic blocks, in FPGA parlance) also include memory elements, which may be simple flip-flops or more complete blocks of memories.

Programmable logic circuits (e.g., field programmable gate arrays (FPGAs)) are widely used in digital system designs. Programmable logic circuits are comprised of an array of unconnected logic elements that can be programmed (i.e., configured) to form a complex logic circuit to accomplish a prescribed function. Most programmable logic circuits employ fuses, anti-fuses, or custom designed metal mask levels to configure the logic elements. Once configured, the resulting logic circuit design is permanent ("firm") and cannot be altered later.

Reconfigurable (or "reprogrammable") logic circuits can be changed to form a different logic function on demand. Reconfigurable logic circuits generally employ a bi-stable data storage element (e.g., a data latch or a Static Random Access Memory (SRAM) cell) within which the logic configuration data is stored. Depending on whether a logical "one" or logical "zero" data is stored in the data storage element, the logic, configuration interface gate or device connected to the data storage element's output is either on or off. In that way, blocks of previously unconnected logic elements are connected and the logic circuit is configured. Selectively changing the data stored in some of the data storage elements allows one to reconfigure the logic circuits when desired. Reconfigurable logic circuits offer a significant advantage over one-time programmable "firm" logic circuits in that the hardware can be changed even after the digital system has been deployed for many years.

Since reprogrammable FPGAs are versatile, they are often found in aerospace applications. Aerospace applications often involve environments where radiation is present. Reprogrammable FPGAs currently available on the market can be very susceptible to a single event upset (SEU). SEUs may be defined as radiation-induced errors in microelectronic circuits caused when charged particles (usually from the radiation belts or from cosmic rays) lose energy by ionizing the medium through which they pass, leaving behind a wake of electron-hole pairs. SEUs are transient soft errors and are non-destructive. A reset or rewriting of the device results in normal device behavior thereafter. An SEU may occur in analog, digital, or optical components, or may have effects in surrounding interface circuitry. SEUs typically appear as transient pluses in logic or support circuitry, or as bit flips in memory cells or registers. Also possible is a multiple-bit SEU in which a single ion hits two or more bits causing simultaneous errors. Multiple-bit SEU is a problem for single-bit error detection and correction (EDAC) where it is impossible to assign bits within a word to different chips (e.g., a problem for Dynamic Random Access Memory (DRAMs) and certain SRAMs). A severe SEU is the single-event functional interrupt (SEFI) in which an SEU in the device's control circuitry places the device into a test mode, halt, or undefined state. The SEFI halts normal operations, and requires system level recovery.

The current state of the art approach to SEU is to refresh the configuration while the FPGA is operating. When using this approach, it may be essential to detect the loss of configuration while the FPGA is operating in a radiation environment, allowing the system to initiate a configuration recovery. More particularly, the conventional solution to detect loss of configuration access involves using external circuitry to read the frame address register (FAR) and write another value to the FAR. Writing to the FAR alters the value stored in the cyclic redundancy checks registers. The system then reads the Cyclic Redundancy Check (CRC) and compares the reading to an expected value. A conflict in the values indicates a loss of configuration access, allowing the external circuitry to initiate a configuration access recovery.

This solution has drawbacks and disadvantages. For example, additional circuitry is employed to facilitate this series of operations, increasing the complexity and the number of components, the board space, and the power for the implementation. Moreover, the addition of components is likely to reduce the overall reliability.

SUMMARY

An embodiment of the current invention generally relates to a method of self-detecting an error in a field programmable gate array (FPGA). The method includes writing a signature value into a signature memory in the FPGA and determining a conclusion of a configuration refresh operation in the FPGA. The method also includes reading an outcome value from the signature memory.

Another embodiment pertains generally to a method of self-detecting an error in a radiative environment. The method includes writing a key value into a signature memory that is flushed during a configuration refresh and initiating a configuration refresh. The method also includes determining an error status in response to the value stored in the signature in response to the configuration refresh.

Yet another embodiment relates generally to a system for self-detecting errors in a radiative environment. The system includes an FPGA core configured to be programmed with a user defined function, and a memory configured to store the user defined function. The system also includes a configuration memory configured to interface with the FPGA core, to provide configuration access memory space and application memory space, and a controller configured to execute a configuration refresh operation that reloads the user defined function from the memory into the FPGA core. The system further includes a self-detecting error module configured to write a key value into the configuration memory, which is flushed during the configuration refresh operation, and to determine an error status in response to the value stored in the configuration memory, in response to the configuration refresh operation. The controller is also configured to initiate the self detecting error module.

Yet another embodiment relates generally to a system for self-detecting errors in a radiative environment. The system includes an electrically erasable programmable read only memory (EEPROM) and a field programmable gate array (FPGA) device. The FPGA device further comprises an FPGA core configured to be programmed with a user defined function and a memory configured to store the user defined function. The system also includes a configuration memory configured to interface with the FPGA core to provide configuration access memory space and application memory space and a controller configured to execute configuration refresh operation that reloads the user defined function from the memory into the FPGA core. The system further includes a self-detecting error module configured to write a key value into the configuration memory that is flushed during the configuration refresh operation, and to determine an error status in response to the value stored in the configuration memory in response to the configuration refresh operation. The controller is also configured to initiate the self-detecting error module.

BRIEF DESCRIPTION OF THE DRAWINGS

Various features of the embodiments can be more fully appreciated, as the same become better understood with reference to the following detailed description of the embodiments, considered in connection with the accompanying figures, in which.

DETAILED DESCRIPTION OF EMBODIMENTS

For simplicity and illustrative purposes, the principles of the present invention are described by referring mainly to exemplary embodiments thereof. However, one of ordinary skill in the art would readily recognize that the same principles are equally applicable to, and can be implemented in, all types of field programmable gate arrays, and that any such variations do not depart from the true spirit and scope of the present invention. Moreover, in the following detailed description, references are made to the accompanying figures, which illustrate specific embodiments. Electrical, mechanical, logical and structural changes may be made to the embodiments without departing from the spirit and scope of the present invention. The following detailed description is, therefore, not to be taken in a limiting sense and the scope of the present invention is defined by the appended claims and their equivalents.

Embodiments relate generally to systems and methods for self-detecting a loss of configuration in a reprogrammable FPGA without the use of any additional circuitry. More particularly, embodiments of a self-detecting error module may be configured to determine whether a single event error has corrupted a configuration refresh operation. A reprogrammable FPGA typically includes a configuration memory which can either be used to control the configuration of the reprogrammable FPGA, or the configuration memory may be used as application memory. This configuration memory is often referred to as distributed memory. A configuration refreshing operation typically clears the contents of the distributed memory, which is the reason why this memory is not normally used in applications requiring configuration refreshes.

The self-detecting error module may be configured to write a unique key into a portion of the configuration memory, i.e., the signature memory. For example, a 16×1 bit memory may represent the signature memory. The self-detecting error module may then determine the conclusion of the configuration refresh operation. Subsequently, the self-detecting error module may execute a read operation from the signature memory. If the self-detecting error module determines that the signature memory contains an expected value, such as all zeroes, all ones or a predefined value, the configuration refresh is a successful operation. If the self-detecting error module determines that the signature contains an unexpected value that is different from a predefined user value, the configuration refresh operation is a failure.

Figure 1:
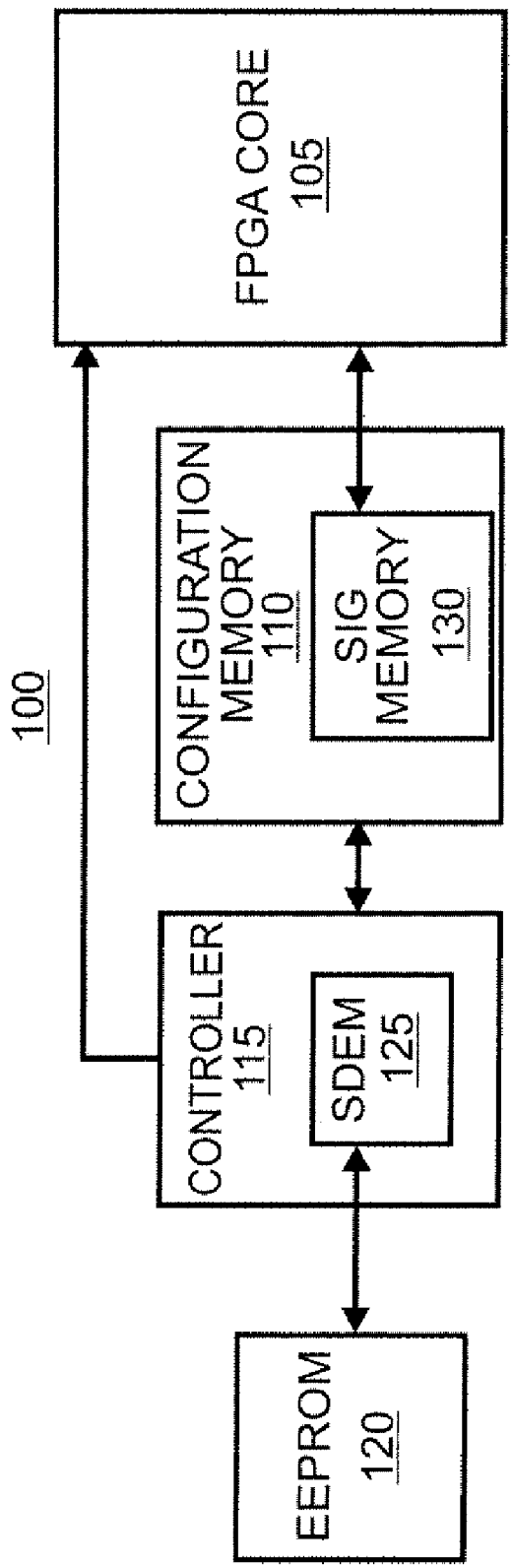
FIG. 1 is a schematic representation illustrating an exemplary embodiment of a self-detecting error module in a system.

FIG. 1 illustrates an exemplary embodiment of a self-detecting error module 125 in a system 100. It should be readily apparent to those of ordinary skill in the art that the system 100 depicted in FIG. 1 represents a generalized schematic illustration and that other components may be added or existing components may be removed or modified. Moreover, the system 100 as well as the self-detecting error module 125 may be implemented using software components, hardware components, or combinations thereof.

As shown in FIG. 1, system 100 includes an FPGA core 105, a configuration memory 110, a controller 115, and an Electrically Erasable Programmable Read-Only Memory (EEPROM) 120. The FPGA core 105 may be configured to include programmable logic components and programmable logic interconnects as known to those skilled in the art. The FPGA core 105 may be configured to implement user defined functions, e.g., combinatorial logic functions.

The FPGA core 105 may be configured to interface with a configuration memory 110, which may interface with a controller 115. The controller 115 may be configured to control and manage the system 100. More particularly, the controller 115 may initiate configuration refresh operation which reloads the user defined function for the system 100. One intended use for the system 100 is in radiative environments where single event upsets (SEUs) may occur. The controller 115 may initiate the configuration refresh operation periodically based on the anticipated levels of radiation.

The controller 115 may also be configured to interface with an Electrically Erasable Programmable Read-Only Memory (EEPROM) 120. The EEPROM 120 may be configured to store a copy of the user-defined function for the system 100. The controller 115 may then initiate configuration refresh operations from the data stored in the EEPROM 120. Various embodiments may implement the EEPROM 120 with a conventional memory such as a DRAM.

In some embodiments, the controller 115 may implement a self-detecting error module 125. The functions of the self-detecting error module 125 may be implemented through software, hardware or combinations thereof. The self-detecting error module 125 may be configured to write a key value into an area of the configuration memory 110, i.e., the signature memory. The key (or signature) value can be a string of bits, for example, "1011111011101111" for a 16 bit memory word. The self-detecting error module 125 may be configured to initiate writing the key value periodically with a user-defined period based on anticipated levels of radiation or in response to an event.

The self-detecting error module 125 may be further configured to determine the end of a configuration refresh operation. For example, the controller 115 may set a flag that the configuration refresh operation concluded. Accordingly, the self-detecting error module 125 may determine whether or not this flag has been set.

The self-detecting error module 125 may be configured to execute a read of the signature memory 130 in response to the end of the configuration refresh operation. The self-detecting error module 125 may then determine the value of the content stored in the signature memory 130. If the value of the content is the expected value, e.g., all zeroes, all ones, or a predefined value, the self-detecting error module 125 may set a flag that no errors were detected in the configuration refresh operation. The self-detecting error module 125 may be configured to set a no-error status or flag for the current configuration with the controller 115 in some embodiments. Otherwise, if the value of the content in the signature memory 130 is an unexpected value, i.e., differs from a predefined expected value, the self-detecting error module 125 may set a flag or set the status that an error occurred in the configuration refresh operation. In some embodiments, the self-detecting error module 125 may set an error status for the configuration refresh operation. The controller 115 may initiate another refresh operation or the error may be reported for later analysis.

Accordingly, the self-detecting error module provides a mechanism for a system to self-detect errors without additional circuitry. Thus, reliability may be enhanced without additional components and power requirements.

Figure 2:
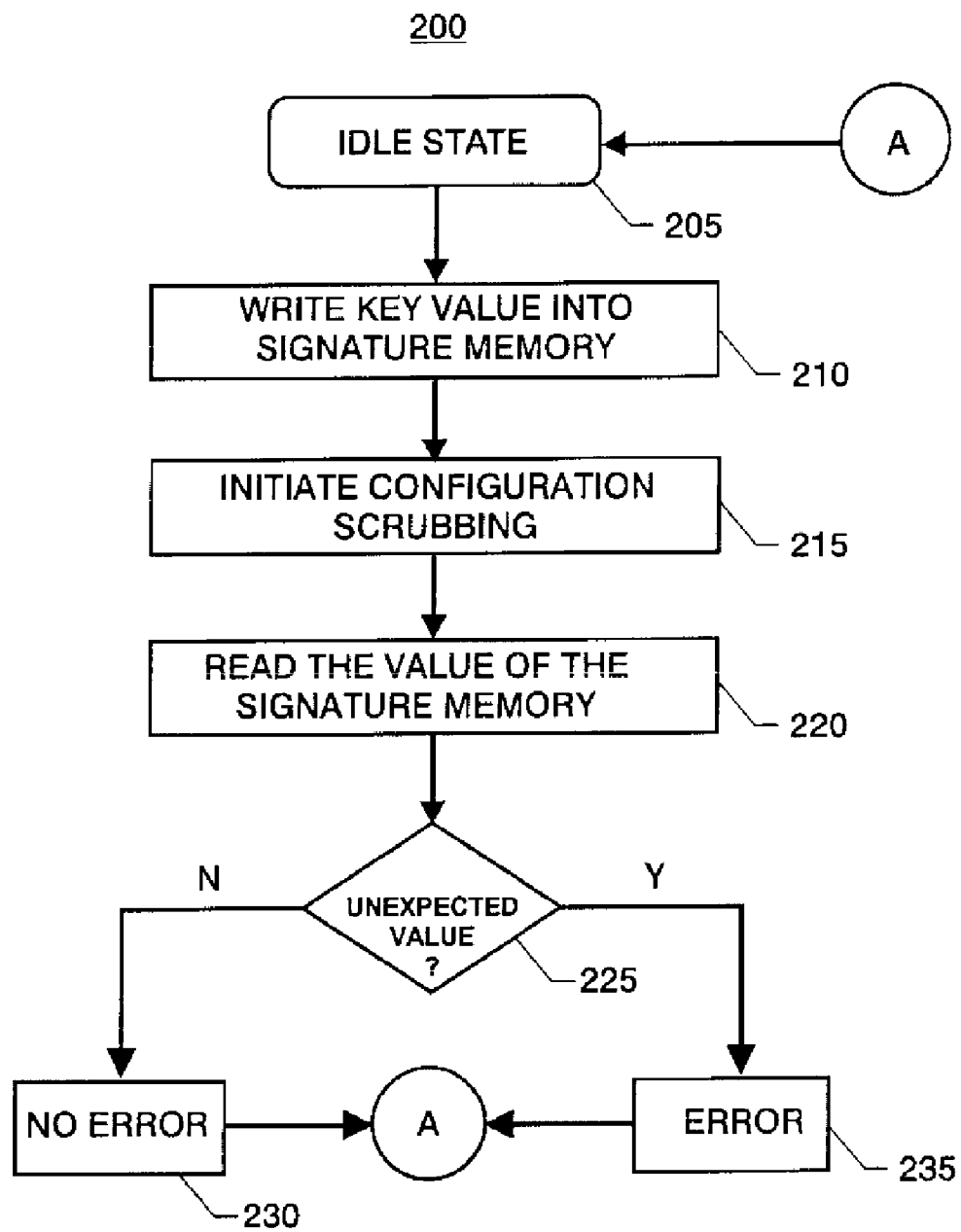
FIG. 2 is a flowchart illustrating an exemplary flow diagram implemented by the self-detecting error module in accordance with an embodiment of the current invention.

FIG. 2 illustrates an exemplary flow diagram 200 implemented by the self-detecting error module 125 in accordance with an embodiment. It should be readily apparent to those of ordinary skill in the art that the flow diagram 200 depicted in FIG. 2 represents a generalized schematic illustration, and that other steps may be added or existing steps may be removed or modified.

As shown in FIG. 2, the self-detecting error module 125 may be configured to be in an idle state, as in step 205. The self-detecting error module 125 may be invoked when the system 100 is powered on.

In step 210, the self-detecting error module 125 may be configured to write a key or signature value into a reserved area of the configuration memory 110, i.e., the signature memory 130. The key value may be a string of bits as wide as the word size of the configuration memory 110, for example 16 bits. Thus, an exemplary key value may be "1011100100011101." The self-detecting error module 125 may move to this step in response to a periodic timer based on the anticipated radiation level in the operating environment of the system 100. In other embodiments, the self-detecting error module 125 may initiate this step in response to an event such as a temperature rising above a threshold temperature.

In step 215, the self-detecting error module 125 may indicate to the controller 115 to initiate a configuration refresh operation. More particularly, the self-detecting error module 125 may set a flag or status that indicates that the key value has been written into the signature memory 130. The controller 115 may then proceed with the configuration refresh operation of reloading the user-defined function stored in the EEPROM 120.

In step 220, the self-detecting error module 125 may be configured to read the content of the signature memory 130 in response to the conclusion of the configuration refresh operation. More particularly, the controller 115 may set a flag or set a status that indicates that the configuration refresh operation has concluded. The self-detecting error module 125 may monitor this flag.

In step 225, the self-detecting error module 125 may determine whether or not the contents of the signature memory 130 contain the expected value. More particularly, during a successful configuration refresh operation, all of the configuration memory 110, including the signature memory 130, should be flushed and the contents of the memory space should be the expected value. Thus, if a non-expected value exists, the unexpected value is an indication of an error most likely caused by a SEU.

In step 230, if the self-detecting error module 125 determines that the contents of the signature memory 130 is the expected value, the self-detecting error module 125 may set a no-error-flag or set a clear status for the controller 115 to indicate that no error had occurred in the configuration refresh operation.

Otherwise, in step 235, if the self-detecting error module 125 determines that the contents of the signature memory 130 contains an unexpected value, the self-detecting error module 125 may set an error flag or set an error status with the controller 115 to indicate an error in the configuration refresh operation. Subsequently, the self-detecting error module 125 may return to the idle state of step 205. In some embodiments, the controller 115 maybe configured to re-initiate a configuration refresh operation in response to the setting of the error flag or error status in the previous configuration refresh operation.

Certain embodiments may be performed as a computer program. The computer program may exist in a variety of forms both active and inactive. For example, the computer program can exist as a software program (or multiple software programs) comprised of program instructions in source code, object code, executable code or other formats; firmware program(s); or hardware description language (HDL) files. Any of the above can be embodied on a computer readable medium, which includes storage devices and signals, in compressed or uncompressed form. Exemplary computer readable storage devices include conventional computer system Random Access Memory (RAM), Read-Only Memory (ROM), Erasable Programmable ROM (EPROM), Electrically Erasable Programmable ROM (EEPROM), and magnetic or optical disks or tapes.

Exemplary computer readable signals, whether modulated using a carrier or not, are signals which a computer system hosting or running the present invention may be configured to access. Such signals may include those downloaded through the Internet or other networks. Concrete examples of the foregoing include distribution of an executable software program (or multiple programs) of the computer program on a CD-ROM or via Internet download. In a sense, the Internet itself, as an abstract entity, is a computer readable medium. The same is true of computer networks in general.

While the invention has been described with reference to the exemplary embodiments thereof those skilled in the art will be able to make various modifications to the described embodiments without departing from the true spirit and scope. The terms and descriptions used herein are set forth by way of illustration only and are not meant as limitations. In particular, although the method has been described by examples, the steps of the method may be performed in a different order than illustrated or simultaneously. Those skilled in the art will recognize that these and other variations are possible within the spirit and scope as defined in the following claims and their equivalents.

What is claimed is:

1. A method of self-detecting an error in a field programmable gate array (FPGA) having an FPGA core configured to implement a user-defined function, a configuration memory having a portion designated as a signature memory, and an electrically-erasable programmable read-only memory (EEPROM) device configured for storing a copy of the user-defined function, the method comprising:

writing a key value into the signature memory from a self-detecting error module within the FPGA in response to a timer-based event, wherein the key value is a string of bits different from the user-defined function;

initiating a configuration refresh operation in response to writing the key value, wherein the configuration refresh operation loads the user-defined function from the EEPROM device to the configuration memory and flushes the signature memory;

determining a conclusion of the configuration refresh operation;

reading an outcome value from the signature memory in response to a conclusion of the configuration refresh operation;

comparing the outcome value to an expected value; and setting an error flag when the outcome value is not equal to the expected value.

2. The method of claim 1, further comprising setting the configuration refresh operation as being successful in response to the outcome value being equal to the expected value.

3. The method of claim 1, further comprising initiating another configuration refresh operation in response to the outcome value not being equal to the expected value.

4. The method of claim 1, wherein the timer-based event is based on one of an anticipated radiation level and a threshold temperature of a radiative environment.

5. A computer readable medium including at least one storage device on which is stored executable code suitable for performing the method of claim 1, the at least one storage device including at least one of: a Random Access Memory (RAM) device, a Read-Only Memory (ROM) device, an Erasable Programmable ROM (EPROM) device, an Electrically Erasable Programmable ROM (EEPROM) device, a disk, and a tape.

6. A method of self-detecting an error in a field programmable gate array (FPGA) operating in a radiative environment, the method comprising:

writing a key value into a signature memory portion of a configuration memory from a self-detecting error module within the FPGA in response to a timer-based event, the timer-based event being based at least in part on a threshold value of the radiative environment, wherein the key value is flushed from the signature memory during a configuration refresh operation;

initiating the configuration refresh operation in response to writing the key value into the signature memory, and wherein the configuration refresh operation loads a user-defined function into the configuration memory for functional control of an FPGA core, the user-defined function being different from the key value;

reading an outcome value stored in the signature memory after the configuration refresh operation has concluded; and comparing the outcome value to an expected value after the configuration refresh operation to thereby determine an error status.

7. The method of claim 6, further comprising determining the error status as no error in response to the outcome value being the expected value.

8. The method of claim 6, further comprising determining the error status as an error in response to the outcome value being an unexpected value.

9. The method of claim 6, further comprising determining an end of the configuration refresh operation.

10. The method of claim 6, wherein the threshold value of the radiative environment is one of an anticipated threshold radiation level and a threshold temperature.

11. A system for self-detecting errors in a field programmable gate array (FPGA) operating in a radiative environment, the system comprising:

an FPGA core configured to be programmed with a user-defined function;

a memory device configured to store the user-defined function, the memory device being external to the FPGA core;

a configuration memory within the FPGA that is configured to interface with the FPGA core to provide configuration access memory space and application memory space;

a controller configured to execute a configuration refresh operation that reloads the user-defined function from the memory device into the configuration memory; and a self-detecting error module within the FPGA that is configured to write a key value into a signature memory portion of the configuration memory in response to a timer-based event;

wherein the key value is different from the user-defined function and is flushed from the signature memory during the configuration refresh operation, wherein the writing of the key value initiates the execution of the configuration refresh operation, and wherein the self-detecting error module is further configured to determine an error status by comparing an outcome value stored in the signature memory after the configuration refresh operation has concluded with an expected value in the configuration memory.

12. The system of claim 11, wherein the self-detecting error module determines the error status as no error in response to the outcome value being the expected value in the configuration memory.

13. The system of claim 11, wherein the self-detecting error module determines the error status as an error in response to the outcome value being an unexpected value in the configuration memory.

14. The system of claim 11, wherein the self-detecting error module determines an end to the configuration refresh operation.

15. The system of claim 11, wherein the self-detecting error module is configured to write the key value periodically in response to the timer-based event.

16. A system for self-detecting errors in a radiative environment, the system comprising:

a memory device adapted for storing a copy of a user-defined function for controlling the system;

an FPGA core configured to interface with an EEPROM and being programmable with the user-defined function;

a controller configured to initiate a configuration refresh operation which loads the user-defined function into a configuration memory, the controller having a self-detecting error module adapted to self-detect the errors without additional circuitry; and a signature memory configured to store a key value provided from the self-detecting error module, wherein the key value is a predefined string of bits different than the user-defined function, and wherein the self-detecting error module is configured to read the signature memory in response to an end of the configuration refresh operation;

wherein the configuration refresh operation reloads the user-defined function from the EEPROM device into the FPGA core;

wherein the self-detecting error module writes the key value in the signature memory flushed during the configuration refresh operation, and wherein the self-detecting error module is configured to determine an error status by comparing an outcome value stored in the signature memory to an expected value after the configuration refresh operation.

17. The system of claim 16, wherein the self-detecting error module determines the error status as no error in response to the outcome value being equal to the expected value in the signature memory.

18. The system of claim 16, wherein the self-detecting error module determines the error status as an error in response to the outcome value being an unexpected value.

19. The system of claim 16, wherein the self-detecting error module determines an end to the configuration refresh operation.

20. The system of claim 16, wherein the self-detecting error module is configured to write the key value periodically in response to a periodic timer.

* * * * *